United States Patent
Omori et al.

(10) Patent No.: US 9,748,344 B2
(45) Date of Patent: Aug. 29, 2017

(54) NITRIDE SEMICONDUCTOR SUBSTRATE HAVING RECESSES AT INTERFACE BETWEEN BASE SUBSTRATE AND INITIAL NITRIDE

(71) Applicant: CoorsTek KK, Tokyo (JP)

(72) Inventors: Noriko Omori, Hadano (JP); Hiroshi Oishi, Hadano (JP); Yoshihisa Abe, Hadano (JP); Jun Komiyama, Hadano (JP); Kenichi Eriguchi, Hadano (JP); Tomoko Watanabe, Hadano (JP)

(73) Assignee: COORSTEK KK, Tokyo (JP)

( * ) Notice: Subject to any disclaimer, the term of this patent is extended or adjusted under 35 U.S.C. 154(b) by 0 days.

(21) Appl. No.: 15/202,736

(22) Filed: Jul. 6, 2016

(65) Prior Publication Data
US 2017/0011919 A1    Jan. 12, 2017

(30) Foreign Application Priority Data

Jul. 8, 2015    (JP) .................................. 2015-136598
May 27, 2016    (JP) .................................. 2016-105768

(51) Int. Cl.
| | |
|---|---|
| *H01L 29/20* | (2006.01) |
| *H01L 29/34* | (2006.01) |
| *H01L 21/02* | (2006.01) |
| *H01L 29/06* | (2006.01) |

(52) U.S. Cl.
CPC ...... *H01L 29/2003* (2013.01); *H01L 21/0243* (2013.01); *H01L 21/0254* (2013.01); *H01L 21/0262* (2013.01); *H01L 21/02381* (2013.01); *H01L 21/02433* (2013.01); *H01L 21/02458* (2013.01); *H01L 21/02639* (2013.01); *H01L 29/0661* (2013.01); *H01L 29/34* (2013.01)

(58) Field of Classification Search
CPC ............. H01L 29/0657; H01L 29/0661; H01L 29/2003; H01L 29/34; H01L 31/03044; H01L 33/20; H01L 33/22; H01L 33/32
See application file for complete search history.

(56) References Cited

U.S. PATENT DOCUMENTS 6,232,623 B1 *    5/2001    Morita ................ H01L 21/0242
                                                              257/103
2013/0092950 A1    4/2013    Fujikura et al.

FOREIGN PATENT DOCUMENTS

JP    2002-323733 A    11/2002
JP    2013-087012 A    5/2013

* cited by examiner

*Primary Examiner* — Stephen W Smoot
(74) *Attorney, Agent, or Firm* — Buchahan Ingersoll & Rooney PC

(57) ABSTRACT

The present invention provides a nitride semiconductor substrate having an initial nitride and a nitride semiconductor sequentially stacked on one principal plane of a base substrate, wherein the nitride semiconductor substrate comprises recesses depressed from an interface between the base substrate and the initial nitride toward the base substrate along one arbitrary cross section; the recesses each have a diameter of 6 nm or more and 60 nm or less and are formed at a density of $3\times10^8$ pieces/cm$^2$ or more and $1\times10^{11}$ pieces/cm$^2$ or less; and the recess preferably has a depth of 3 nm or more and 45 nm or less from the interface between the base substrate and the initial nitride toward the base substrate.

2 Claims, 2 Drawing Sheets

NITRIDE SEMICONDUCTOR SUBSTRATE HAVING RECESSES AT INTERFACE BETWEEN BASE SUBSTRATE AND INITIAL NITRIDE

BACKGROUND OF THE INVENTION

Field of the Invention

The present invention relates to a nitride semiconductor substrate suitably used for the power semiconductor, electronic devices, etc.

Description of the Related Art

As the technique of providing the crystal growth method for a nitride semiconductor for improving the performance and the lifetime of the semiconductor device by reducing the dislocation density, JP-A-2002-323733 has disclosed the crystal growth method for a nitride semiconductor, the method including a first crystal growth step of forming a plurality of island-shaped crystal regions of nitride semiconductor on a base through vapor-phase growth, and a second crystal growth step of growing the island-shaped crystal regions further while linking the borders of the island-shaped crystal regions. In this method, the crystal growth speed in the second crystal growth step is set higher than the crystal growth speed in the first crystal growth step, or the crystal growth temperature in the second crystal growth step is set lower than the crystal growth temperature in the first crystal growth step. This enables the dislocation to be bent in the border linking portion so that the dislocation density can be decreased. The mechanism of the formation of a nitride layer when the nitride semiconductor layer is formed on the base substrate through the vapor-phase growth is a public knowledge.

JP-A-2013-087012 has disclosed the substrate for the nitride semiconductor growth, which enables to grow the nitride semiconductor with the low dislocation density. The substrate is a sapphire substrate whose main plane is the C-plane. On the main plane, conical or truncated projections having a side surface tilted by less than 90° relative to the main plane are formed in the lattice form. The height of the projection from the main plane is 0.5 μm or more and 3 μm or less, and the distance between the adjacent projections is 1 μm or more and 6 μm or less. The surface roughness RMS of the side surface of the projection is 10 nm or less. That is to say, it has also been known that the uneven shape of the one principal plane of the base substrate has an influence on the characteristics of the nitride semiconductor formed thereon.

The invention according to JP-A-2002-323733 is to decrease the dislocation of the nitride semiconductor layer by optimizing the growth condition for the nitride semiconductor layer. If the uniform growth of the nitride semiconductor layer on the entire surface of the substrate is failed, the high-quality nitride semiconductor layer may not be obtained.

The invention according to JP-A-2013-087012 is to eliminate the dislocation by making the base substrate uneven in advance to optimize the growth speed of the nitride semiconductor layer. However, forming the unevenness of such a size within the surface of the substrate with high accuracy results in the cost increase of the base substrate. Moreover, it is necessary to form the initial nitride semiconductor layer to such a degree that the unevenness is fully covered up, and this increases the cost of manufacturing the nitride semiconductor layer. If the unevenness is not formed uniformly, the nitride semiconductor layer to be formed thereon is possibly non-uniform.

That is to say, it is necessary that the uneven shape on one principal plane of the base substrate should be formed with the uniform and appropriate size. In addition, the uneven shape is desirably formed at the industrially low cost and with high accuracy.

SUMMARY OF THE INVENTION

The present invention has been made in view of the above, and an object is to provide easily a nitride semiconductor with the excellent breakdown voltage characteristic.

A nitride semiconductor substrate according to an embodiment of the present invention has an initial nitride and a nitride semiconductor sequentially stacked on one principal plane of a base substrate, wherein the nitride semiconductor substrate includes recesses depressed from an interface between the base substrate and the initial nitride toward the base substrate along one arbitrary cross section, and the recesses each have a diameter of 6 nm or more and 60 nm or less and are formed at a density of $3 \times 10^8$ pieces/cm$^2$ or more and $1 \times 10^{11}$ pieces/cm$^2$ or less. With this structure, the nitride semiconductor substrate with the excellent breakdown voltage characteristic can be provided by a simple structure.

Further, the recess preferably has a depth of 3 nm or more and 45 nm or less from the interface between the base substrate and the initial nitride toward the base substrate.

The recess is different from the base substrate in at least one of composition, crystal structure, crystal orientation, and crystal phase.

In addition, the recess is preferably at least one of a space and a mode filled with a polycrystalline or amorphous inorganic material.

According to the present invention, the initial layer including the base substrate and the initial nitride thereon includes the recesses, each of which has a diameter of 6 nm or more and 60 nm or less, at a density of $3 \times 10^8$ pieces/cm$^2$ or more and $1 \times 10^{11}$ pieces/cm$^2$ or less. With this simple structure, the nitride semiconductor substrate with the excellent breakdown voltage characteristic can be provided.

DESCRIPTION OF THE EMBODIMENTS

Figure 1:
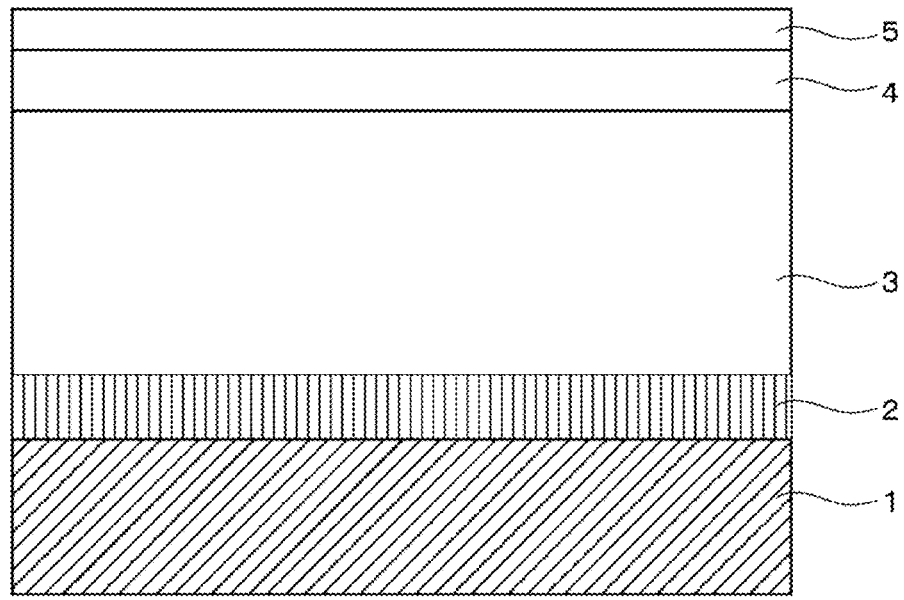
FIG. 1 is a schematic sectional view illustrating a stack structure of one example of a nitride semiconductor substrate according to an embodiment of the present invention.

The present invention will be described in detail with reference to the drawings. In one example of a nitride semiconductor substrate according to an embodiment of the present invention, a layer 2 including an initial nitride (hereinafter also referred to as "layer 2" simply), and a buffer layer 3, an electron transit layer 4, and an electron supply layer 5 as nitride semiconductor layers 3, 4, and 5 are stacked in this order, and this stack is formed on one principal plane of a base substrate 1 as illustrated in FIG. 1.

For the base substrate 1, a known material used for growing the nitride semiconductor layer, such as silicon carbide or sapphire, can be used. In particular, using silicon single crystal is more preferable because the structure of the present invention can be achieved easily and certainly due to the reasons below.

On one principal plane of the base substrate 1, the layer 2 including the initial nitride is formed. The layer 2 plays a role of appropriately forming the buffer layer 3 (nitride semiconductor layer 3) with the different lattice constant or thermal expansion coefficient on the base substrate 1, and the film thickness, composition, etc. thereof can be set as appropriate in accordance with the intended purpose. If the buffer layer is formed of a nitride semiconductor including Ga and Al, aluminum nitride (AlN) is preferable from the viewpoints of flatness, dislocation controllability, and the like.

As the method for forming the layer 2 including the initial nitride and the buffer layer 3 (nitride semiconductor layer 3), for example, the vapor-phase growth method, particularly the metal organic chemical vapor deposition (MOCVD) method is preferable and other methods are also applicable.

On one principal plane of the base substrate 1, $3 \times 10^8$ pieces/cm$^2$ or more and $1 \times 10^{11}$ pieces/cm$^2$ or less of recesses are formed. The recess has a diameter of 6 nm or more and 60 nm or less and is depressed from the interface between the base substrate and the initial nitride toward the base substrate 1 along one arbitrary cross section of the nitride semiconductor substrate.

Figure 2:
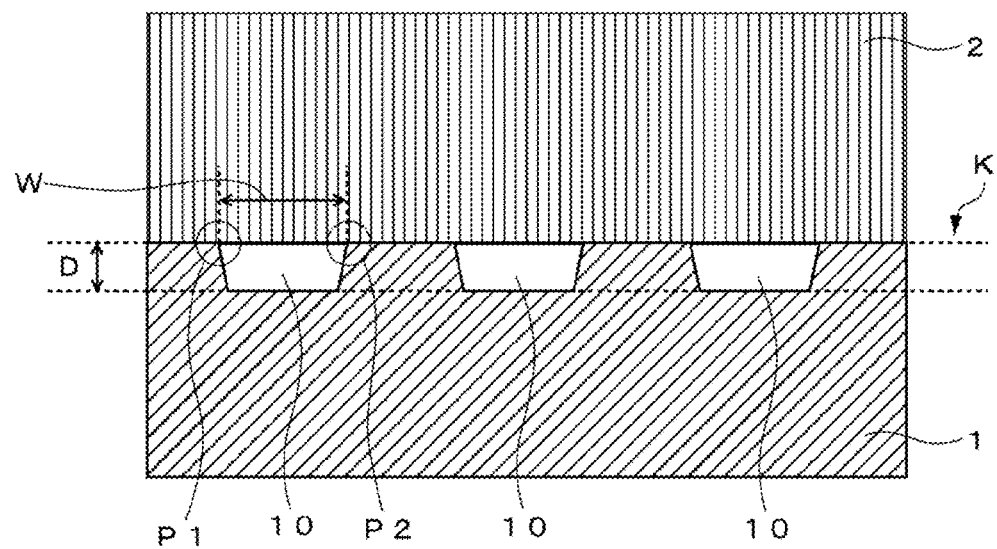
FIG. 2 is a sectional view schematically illustrating recesses provided for the surface layer part of one principal plane of a base substrate of the nitride semiconductor substrate according to an embodiment of the present invention.

FIG. 2 is a sectional view schematically illustrating a recess 10 provided for a surface layer part of one principal plane of the base substrate 1. Here, K represents one principal plane of the base substrate 1, W represents the diameter of the recess 10, and D represents the average depth of the recess 10. In the present invention, the depth is represented by the average depth D. The recess 10 is filled with a material X (not shown).

It is difficult to manufacture the nitride semiconductor substrate completely uniformly up to the very outer periphery of the substrate due to the manufacturing process, and the observation of a cross section of the nitride semiconductor substrate should be carried out excluding the very outer periphery. For this reason, the position approximately 5 to 25 mm inward from the outer periphery is preferable as the observation position.

In the present invention, "cross section" corresponds to the plane perpendicular to one principal plane of the base substrate 1 but is not necessarily in the strictly perpendicular direction and the deviation by approximately ±20° from the direction perpendicular to the one principal plane is allowed. For example, the cleaved plane obtained by cleaving the silicon single-crystal substrate 1 with the plane orientation (111) with a diamond pen or the like is 19.47° and this does not lead to any problem practically.

In the present invention, the diameter W corresponds to the distance measured between corners p1 and p2 formed by the base substrate 1 and the recess 10 or the material X (not shown) filling the recess 10 on one principal plane K as illustrated in FIG. 2. In fact, the recess 10 has an approximately circular shape, an approximately elliptical shape, or a polygonal shape without corners when viewed from the one principal plane direction. In the present invention, the distance between the corners p1 and p2 in the observation of the cross section is regarded as the diameter W of the recess 10.

Figure 3:
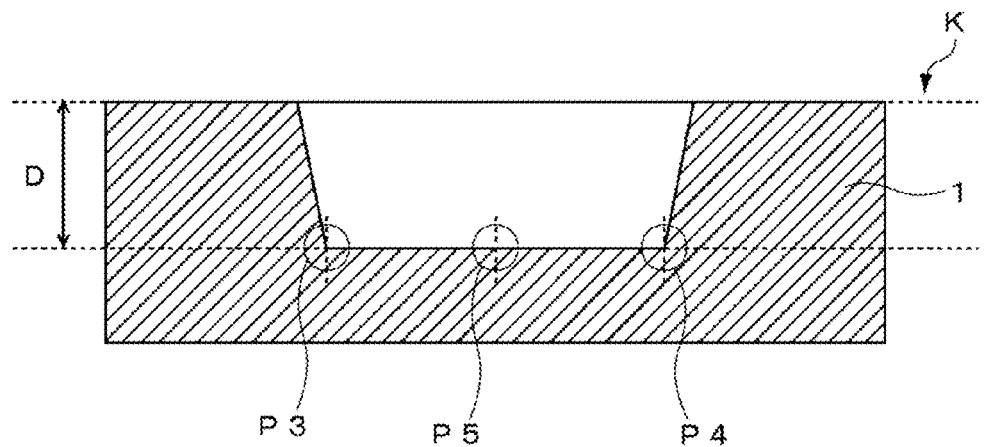
FIG. 3 is a sectional view for schematically describing the diameter and the average depth of the recess of the nitride semiconductor substrate according to an embodiment of the present invention.

The average depth D in the present invention is the average value of the distances between the main plane K and the three points p3, p4, and p5. The points p3 and p4 are the corners formed at the border between the base substrate 1 and the recess 10 or the material X (not shown) filling the recess 10, and the point p5 is a center part of a line between the two corners p3 and p4 below the one principal plane K as illustrated in FIG. 3.

In a preferred example, the diameter W, the average depth D, and the one principal plane K are obtained by observing the cross section formed by cleaving or cutting in another method the nitride semiconductor substrate along an arbitrary diameter and polishing the cross section. The extraction is carried out at three positions in total: the center of the nitride semiconductor substrate in the plane cleaved relative to the diameter direction and two positions 20 mm inward from the outer periphery on both sides. At the place where the extraction is carried out, five arbitrary recesses 10 are selected in the width range of 500 nm in the image, and the diameters W and the average depths D are observed and the average value thereof is employed.

The density of the recesses 10 in the present invention (number of recesses per square centimeters) is calculated by averaging the number of adjacent recesses 10 in the width range of 500 nm in the image at the three positions, and the number of recesses per unit area cm$^2$ is calculated.

The above example is one preferable example but the place from which the cross section is obtained is not limited to the center and the outer periphery, and any other three places may be employed as necessary. The width may be set in the range of 300 nm to 1000 nm as necessary.

The density of the recesses 10 is represented by the number of recesses per unit area in the above preferred example, but may alternatively be represented by the density per unit length. In the observation with the transmission electron microscope (TEM), the target is seen through also in the thickness direction; in this case, the density is calculated by the number of recesses per unit area. On the other hand, in the observation with the scanning electron microscope (SEM), the density is calculated by the number of recesses per unit length; in this case, the conversion in unit length is preferable. As an example, if the density is calculated per unit length, a density of $1 \times 10^3$ pieces/cm or more and $3 \times 10^5$ pieces/cm or less is preferable in the present invention.

The size, the number of pieces, and the like of the recesses 10 can be known by the direct measurement from the image of cross-sectional observation with the TEM, and may alternatively be obtained by processing and analyzing the image. Instead of TEM, for example, SEM or the scanning transmission electron microscope (STEM) may be used.

As is known in the art, it is difficult to form the island-like body of the initial nitride on the flat one principal plane and therefore the crystallinity of the layer 2 to be formed thereon (on the one principal plane) is poor. For this reason, a certain degree of unevenness or step is formed on the one principal plane of the base substrate 1.

In the present invention, the recesses 10 corresponding to the unevenness are formed to be much smaller than the conventional ones, so as to make it more frequent to form the island-like body of the initial nitride per unit area on the one principal plane. In addition, the island-like body itself has the very small size and thus a number of small island-like bodies are formed. Thus, the layer 2 has the excellent flatness and the excellent crystallinity as compared to the conventional one.

As a result, the layer 2 has the excellent crystallinity and therefore the nitride semiconductor layers 3, 4, and 5 formed on the layer 2 have the improved breakdown voltage characteristic.

In the present invention, the recesses 10 are depressed from the interface between the base substrate 1 and the layer 2 toward the base substrate 1 along one arbitrary cross section of the nitride semiconductor substrate and have a diameter of 6 nm or more and 60 nm or less and a density of $3 \times 10^8$ pieces/cm$^2$ or more and $1 \times 10^{11}$ pieces/cm$^2$ or less.

The recess 10 has a diameter W of 6 nm or more and 60 nm or less. When the diameter W is less than 6 nm, the formation of the island-like body may be failed and when the diameter W is more than 60 nm, the recess 10 may generate another crystal defect.

The recess 10 preferably has a depth of 3 nm or more and 45 nm or less (average depth D) from the interface between the base substrate 1 and the layer 2 toward the base substrate 1. At an average depth of less than 3 nm, the formation of the island-like body may be failed; on the other hand, at an average depth of more than 45 nm, the recess 10 may generate another crystal defect. The average depth D is preferably 10 nm or more and 20 nm or less.

In the present invention, the recesses 10 exist at a density of $3 \times 10^8$ pieces/cm$^2$ or more and $1 \times 10^{11}$ pieces/cm$^2$ or less.

When the density is less than $3 \times 10^8$ pieces/cm$^2$, the island-like bodies are formed too apart from each other so that it becomes less probable that the bodies grow to be combined with each other, in which case the bodies may remain as the crystal defect. On the other hand, when the density is more than $1 \times 10^{11}$ pieces/cm$^2$, the recesses 10 are too close to each other and the island-like bodies formed therefrom are combined and grow together and these remain as the protrusions, which still lead to the crystal defect.

The recess 10 is different from the base substrate 1 in at least one of the composition, the crystal structure, the crystal orientation, and the crystal phase. That is to say, the effect of the present invention is exhibited if the recess 10 is different from the base substrate 1 in at least one of the above elements. In other words, it is only necessary that the recess 10 is not the same as the base substrate 1, and a wide range of mode is allowed.

The effect of the present invention is obtained even if the recess 10 is a space not containing any material. The space refers to, for example, a defect, a void, a closed pore, or the like. In regard to the space, the entire recess 10 is not necessarily the space but some material may exist in a part of the recess 10.

Alternatively, the material X and the base substrate 1, which have the same composition but are different in whether they are polycrystalline or amorphous relative to the single crystal, or which are formed of single crystal but are different in crystal orientation, are still allowed within the scope of the present invention.

With such a structure, the initial nitride growing on the recess 10 is different significantly from the initial nitride growing on the base substrate 1 in the growth speed and the growth direction, so that the island-like body is formed effectively in the initial stage.

In one example, if the base substrate 1 is formed of a single crystal with a crystal orientation (111), the material X is a single crystal whose orientation is other than the crystal orientation (111), for example, the crystal orientation (100), (110), or (115).

The material X to fill the recess 10 is preferably the inorganic material and more preferably polycrystalline or amorphous oxide or nitride. Specific examples of the material X include an oxygen precipitate included in a surface layer part of the silicon single-crystal substrate doped with boron at high concentration. That is to say, if the material X is polycrystalline or amorphous, the recess 10 is filled with the polycrystalline or amorphous material easily and certainly.

Figure 4:
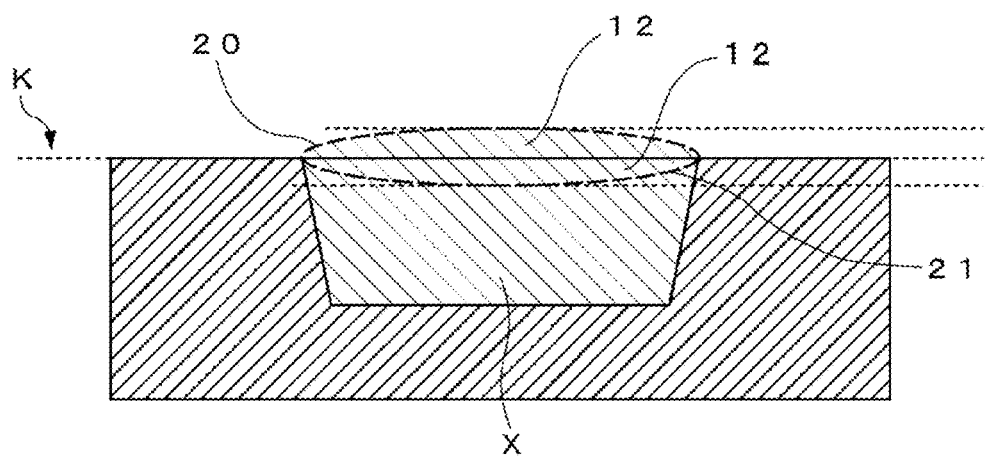
FIG. 4 is a sectional view schematically illustrating the filled recess of the nitride semiconductor substrate according to an embodiment of the present invention.

In the present invention, "filling" refers to the filling of the recess 10 below one principal plane K, i.e., on the base substrate 1 side with the material X (for example, various kinds of inorganic material) only. However, the interface between the material X and the layer 2 does not necessarily coincide with the one principal plane K completely, and the interface region between the material X and the layer 2 may constitute the gradient unevenness. In other words, the presence of an extension part 12 in the vertical direction, which is formed of a border line 20 or 21 as illustrated in FIG. 4, is allowed within the present invention.

The range (intervals) of the unevenness of the extension part 12 is preferably within ±20% of the average depth D, and more preferably ±10%. If the extension parts 12 are formed at large intervals, the curve degree of the unevenness is excessive, in which case the layer 2 formed right above the unevenness will grow depending on this curve degree and the crystal defect may be caused.

The nitride semiconductor substrate according to an embodiment of the present invention has the layer 2 including the initial nitride, and the nitride semiconductor layers 3, 4, and 5 (buffer layer 3, electron transit layer 4, and electron supply layer 5) stacked in this order on the one principal plane K of the base substrate 1. Since the base substrate 1 has the characteristic recesses 10 as described above, the dislocation density in the initial nitride and the nitride semiconductor is small and the nitride semiconductor substrate with the improved breakdown voltage characteristic can therefore be provided.

In the present invention, if the base substrate 1 is the silicon single crystal, it is more preferable that the silicon single crystal contains boron by $1 \times 10^{18}$ atoms/cm$^3$ or more. If the boron concentration is too high, the crystal defect may be further caused; thus, the upper limit is preferably $5 \times 10^{20}$ atoms/cm$^3$ or less.

If the silicon single-crystal substrate 1 is the substrate doped with boron at high concentration, the substrate has the higher strength and the warpage thereof is suppressed. The base substrate 1 that warps less does not deform largely when the initial nitride is stacked, and the effect of suppressing the dislocation is exhibited synergistically.

In addition, the silicon single-crystal substrate 1 doped with boron at high concentration contains the relatively small and high dense oxygen precipitate i.e. material X, which will produce the recess 10, in the surface layer part. Thus, this is preferable in manufacturing the recesses 10 with the size and distribution according to the embodiment of the present invention through the thermal treatment to be described below.

It is more preferable that the boron concentration is $5 \times 10^{18}$ atoms/cm$^3$ or more because the density of the oxygen precipitate is increased within the scope of the present invention and the effect of the present invention is improved.

A preferable manufacturing method for the nitride semiconductor substrate according to an embodiment of the present invention includes the step of performing thermal treatment on the silicon single-crystal substrate 1 with an oxygen concentration of $8 \times 10^{17}$ atoms/cm$^3$ or more and $1.8 \times 10^{18}$ atoms/cm$^3$ or less in the non-oxidative atmosphere at least for one minute or more and at least at 1000° C. or more.

Performing the thermal treatment on the silicon single-crystal substrate 1 with an oxygen concentration of $8 \times 10^{17}$ atoms/cm$^3$ or more and $1.8 \times 10^{18}$ atoms/cm$^3$ or less in the non-oxidative atmosphere at least for one minute or more and at least at 1000° C. or more eliminates partly or entirely the oxygen precipitates exposed to the substrate surface due to the oxygen outward diffusion, and the trace of the precipitates remain as the cavities. In the present invention, the cavity is used as the recess 10.

Here, the recess with the large cavity is filled with the initial nitride and the small recess is filled with the remaining silicon oxide and initial nitride, and in the precipitate portion without the depression, the silicon oxide constitutes the material X of the recess 10.

Performing the thermal treatment on the silicon single-crystal substrate 1 with an oxygen concentration of $8 \times 10^{17}$ atoms/cm$^3$ or more and $1.8 \times 10^{18}$ atoms/cm$^3$ or less in the non-oxidative atmosphere at least for one minute or more and at least at 1000° C. or more can provide the base substrate 1 with the diameter W, the average depth D, and the density distribution as in the present invention. If the oxygen concentration is too low, the density possibly becomes too small; if the oxygen concentration is too high, the diameter W and the average depth D possibly become excessive.

The diameter W, the average depth D, and the density of the recess 10 can be adjusted in the thermal treatment in the non-oxidative atmosphere at least for one minute or more and at least at 1000° C. or more. If the temperature in the thermal treatment is too low or the length of time of the thermal treatment is too short, the diameter W and the average depth D possibly become too small. If the temperature in the thermal treatment is too high or the length of time of the thermal treatment is too long, the diameter W and the average depth D possibly become too large.

Needless to say, the recess 10 may be formed by another method that can achieve the diameter W, the average depth D, and the density according to an embodiment of the present invention, such as a chemical surface treatment.

As described above, the nitride semiconductor substrate according to an embodiment of the present invention has the special structure that high dense and very small recesses 10, which may be filled with the inorganic material, are formed on one principal plane of the base substrate. Simply with this structure, the dislocation of the nitride semiconductor layer formed on the base substrate can be reduced and particularly, the breakdown voltage characteristic can be drastically improved.

EXAMPLES

The present invention will be described more specifically based on examples; however, the present invention is not limited by the examples below.

Example 1

(Preparation of Base Substrate)

First, a silicon single-crystal substrate doped with boron and having a diameter of 6 inches, a plane orientation of (111), a specific resistance of 0.004 Ωcm, and an oxygen concentration of $1.0 \times 10^{18}$ atoms/cm$^3$ was prepared as the base substrate.

(Stacking Initial Nitride and Nitride Semiconductor)

The nitride semiconductor substrate with the layer structure as illustrated in FIG. 1 was manufactured through the following process.

First, the silicon single-crystal substrate was set in the MOCVD apparatus, and the temperature was increased and the gas was replaced. After that, the thermal treatment was performed for 1000° C.×15 minutes in the 100% hydrogen atmosphere.

Subsequently, the layer 2 of the initial nitride including AlN single crystal with a carbon concentration of $1 \times 10^{18}$ atoms/cm$^3$ and a thickness of 100 nm was grown in the vapor phase at 500° C. using trimethyl aluminum (TMA) and ammonia (NH$_3$) as the source gas. Note that in the formation of the subsequent Group-13 nitride semiconductor layer, the growth temperature was set based on 1000° C. and minutely adjusted in the range of 1 to 15° C. above or below this temperature. On the layer 2, Al$_x$Ga$_{1-x}$N single-crystal layer (x=0.1) with a carbon concentration of $5 \times 10^{19}$ atoms/cm$^3$ and a thickness of 300 nm was grown in the vapor phase using trimethyl gallium (TMG), TMA, and NH$_3$ as the source gas.

Next, eight AlN single-crystal layers each with a thickness of 5 nm and eight GaN single-crystal layers each with a thickness of 30 nm were alternately grown in the vapor phase with a carbon concentration of $5 \times 10^{19}$ atoms/cm$^3$ using TMG, TMA, and NH$_3$ as the source gas, and subsequently, a GaN single-crystal layer with a thickness of 1250 nm was stacked similarly with a carbon concentration of $1 \times 10^{18}$ atoms/cm$^3$; thus, the buffer layer 3 was formed.

After that, a GaN single-crystal layer with a thickness of 700 nm and a carbon concentration of $1 \times 10^{16}$ atoms/cm$^3$ was similarly stacked as the electron transit layer serving as the active layer 4, and furthermore an Al$_y$Ga$_{1-y}$N single-crystal layer (y=0.26) with a thickness of 18 nm was similarly stacked as the electron supply layer and thus, the Group-13 nitride semiconductor substrate was obtained.

The thickness and the carbon concentration of each layer formed by the vapor-phase growth were controlled by adjusting the flow rate of the source gas, the gas supply time, the substrate temperature, and other known growth condition.

Comparative Example 1

The condition of the thermal treatment was set to be similar to Example 1 except the temperature was set to 1000° C. and the length of time was set to 5 minutes.

The breakdown voltage of the nitride semiconductor substrate manufactured as above was evaluated. The breakdown voltage was evaluated in a manner that: grooves for the recess gate region and the element separation region were formed in each nitride semiconductor substrate by dry etching, a Ni/Au electrode as the gate electrode and Ti/Al electrodes as the source electrode and the drain electrode on the electron supply layer 5 side, and a Ti/Al electrode as the back electrode on the back side of the base substrate were formed by vacuum deposition, and 28 HEMT devices were manufactured on the surface. The breakdown voltage of the HEMT devices was measured using the commercial curve tracer. The element with a breakdown voltage of 600 V or more is determined as acceptable and the element with a breakdown voltage of less than 600 V is determined as unacceptable, and the ratio of the acceptable elements among the 28 elements is expressed as the breakdown voltage yield (%).

Table 1 shows the results of the breakdown voltage yield and the size and density of each recess 10 measured with the TEM at three positions including the center of the one principal plane of the substrate and two positions 20 mm inward from the outer periphery (both ends). In Table 1, a breakdown voltage yield of 50% or more is expressed with a circular mark (○) and a breakdown voltage yield of less than 50% is expressed with a cross mark (×).

TABLE 1

|  | Diameter W (nm) | Average depth D (nm) | Density (×10$^8$ pieces/cm$^2$) | Breakdown voltage yield (%) |
|---|---|---|---|---|
| Example 1 | 26 | 13 | 100 | 90 (○) |
| Comparative Example 1 | 65 | 15 | 8 | 40 (×) |

The results of Table 1 show that Example 1 within the scope of the present invention provides a breakdown voltage yield of 80% or more, which is preferable. On the other hand, Comparative Example 1 in which the diameter W is out of the scope of the present invention provides a breakdown voltage yield of less than 50%, and this is inferior to Example 1.

The oxide film formed on the surface of the silicon single-crystal substrate is completely eliminated in Example 1, in which the thermal treatment is carried out for a long time, and the oxide film remains partly in Comparative Example 1, in which the thermal treatment is carried out for a shorter time. Therefore, in Example 1, the recesses 10 are formed uniformly as a whole on one principal plane, and as a result, the recesses 10 with the relatively small diameter W are formed at high density.

In contrast to this, in Comparative Example 1, since the oxide film remains partly, the recesses 10 are hardly formed in the place where the oxide film remains, and the recesses 10 are concentrated in the place where the oxide film is not formed. As a result, the diameter W of the single recess 10 is increased and the density of the recesses 10 is decreased.

Note that in Example 1 and Comparative Example 1, some recesses 10 are the cavity as a whole while others contain both the space and the amorphous material X including silicon, oxygen, and nitrogen.

Here, the comparison between Example 1 and Comparative Example 1 indicates that the diameter W and the average depth D are smaller in Example 1, in which the thermal treatment is carried out for a long time, than in Comparative Example 1; this tendency is a little different from the tendency based on the condition of the thermal treatment as described above. In view of this, the present inventors have conducted further experiments to find the more preferable condition for carrying out the present invention.

Example 2

A sample according to Example 2 was manufactured and evaluated in a manner similar to Example 1 except that the condition of the thermal treatment was set to 1000° C.×7 minutes.

Example 3

A sample according to Example 3 was manufactured and evaluated in a manner similar to Example 1 except that the condition of the thermal treatment was set to 1000° C.×10 minutes.

Example 4

A sample according to Example 4 was manufactured and evaluated in a manner similar to Example 1 except that the condition of the thermal treatment was set to 1000° C.×30 minutes.

Comparative Example 2

A sample according to Comparative Example 2 was manufactured and evaluated in a manner similar to Example 1 except that the condition of the thermal treatment was set to 1100° C.×10 minutes.

Comparative Example 3

A sample according to Comparative Example 3 was manufactured and evaluated in a manner similar to Example 1 except that the condition of the thermal treatment was set to 900° C.×10 minutes.

Comparative Example 4

A sample according to Comparative Example 4 was manufactured and evaluated in a manner similar to Example 1 except that the condition of the thermal treatment was set to 800° C.×10 minutes.

The size and the density of the recesses 10 in Examples 2 to 4 and Comparative Examples 2 to 4 were measured in a manner similar to those shown in Table 1. Table 2 shows the results of those and moreover the breakdown voltage yield. In Table 2, a breakdown voltage yield of more than 60% is expressed with a circular mark (○), a breakdown voltage yield of 50% or more and 60% or less is expressed with a triangular mark (Δ), and a breakdown voltage yield of less than 50% is expressed with a cross mark (×).

TABLE 2

|  | Diameter W (nm) | Average depth D (nm) | Density (×10$^8$ pieces/cm$^2$) | Breakdown voltage yield (%) |
|---|---|---|---|---|
| Example 2 | 41 | 15 | 30 | 60 (Δ) |
| Example 3 | 15 | 10 | 100 | 95 (○) |
| Example 4 | 30 | 15 | 100 | 85 (○) |
| Comparative Example 2 | 70 | 20 | 20 | 30 (×) |
| Comparative Example 3 | 4 | 2 | 1100 | 10 (×) |
| Comparative Example 4 | — | — | — | 0 (×) |

The results shown in Table 2 indicate that the breakdown voltage yield is 60% in Example 2, which is inferior to a breakdown voltage yield of 90% in Example 1. It is considered that since the thermal treatment is carried out for a shorter time in Example 2 than Example 1, the oxide film remains partly in Example 2 so that the diameter W is relatively large. In Example 2, however, the recesses 10 are formed at sufficiently high density as compared to Comparative Example 1; therefore, a breakdown voltage yield of more than 50% is secured.

Example 3 provides a breakdown voltage yield of 95%, which is superior to Example 1 with a breakdown voltage yield of 90%. As described above, if the oxide film formed on the surface of the silicon single-crystal substrate remains, the recess 10 tends to have larger diameter W. However, in Example 3, the thermal treatment is performed for an optimal period of time of such a degree that the oxide film is substantially eliminated, so that the diameter W is smaller than that in Example 1 and is optimum. With the oxide film substantially eliminated, the recesses 10 can be formed uniformly on one principal plane and the breakdown voltage yield is improved.

Therefore, in Example 2 in which the thermal treatment is carried out for a shorter time than in Example 3, the breakdown voltage yield tends to slightly decrease because of the influence from the remaining oxide film. That is to say, the state in which the length of time of the thermal treatment is optimized and the oxide film formed on the surface of the silicon single-crystal substrate is eliminated completely and the thickness of the oxide film is just zero is the best mode of the present invention; in this case, the breakdown voltage yield is remarkably high.

However, when the thermal treatment is carried out for too long, the formed recess 10 will further grow to have larger diameter W and average depth D. In Example 1, the thermal treatment is carried out for a longer time than in Example 3, so that the individual recess 10 is relatively large. In regard to the breakdown voltage yield, the breakdown voltage yield in Example 3 is higher than in Example 1. That is to say, in Example 3, the size of the recess 10 is optimized further and the preferred range of the diameter W in the present invention is 10 nm or more and 20 nm or less.

In Example 4, the breakdown voltage yield is 85%, which is superior to that in Example 2 but inferior to that in Example 1. In Example 4, the thermal treatment was carried out for 30 minutes, which is longer than in Example 1, so that the recess 10 has grown further and its diameter W has increased out of the preferable range of 10 nm or more and 20 nm or less; thus, the breakdown voltage yield has decreased a little. ここまで

On the other hand, in Comparative Example 2, the diameter W is 70 nm, which is out of the range of the present invention, and as a result, the breakdown voltage yield has largely decreased to 30%. It is considered that this is because the temperature of the thermal treatment in Comparative Example 2 is set to 1100° C., which is higher than 1000° C. in Examples 1 to 4. With this temperature, the growth of the recess 10 is promoted suddenly and the size is increased largely. The growth of the recess 10 is largely influenced by the temperature of the thermal treatment rather than the length of time of the thermal treatment.

In Comparative Example 3, the temperature of the thermal treatment is reduced to 900° C. As a result, the diameter W is as small as 4 nm and the breakdown voltage yield is decreased to 10%. When the temperature of the thermal treatment is low, a number of microscopic holes are formed in a part of the oxide film, and the microscopic recesses 10 are formed below these holes. Therefore, the recesses 10 are formed but the size is not increased that much due to the influence of the oxide film which remains much more than Examples 1 to 4. Furthermore, because the oxide film mostly remains on the surface of the silicon single-crystal substrate, the crystallinity of the nitride semiconductor layer formed thereon is deteriorated and accordingly the leakage current is increased and the breakdown voltage yield is deteriorated.

In Comparative Example 4, the temperature of the thermal treatment is reduced further to 800° C., which is lower than in Comparative Example 3. In this case, the temperature is so low that the oxide film mostly remains, and the recess 10 is therefore not formed. Accordingly, the oxide film remains on the entire surface of the base substrate, and the crystallinity of the nitride semiconductor layer formed thereon remarkably deteriorates and the leakage current is increased and the breakdown voltage yield is zero.

Thus, in a preferred embodiment of the present invention, if the base substrate 1 is formed of silicon single crystal, the thermal treatment condition before the layer including the initial nitride is formed is optimized so that the recess 10 has the appropriate size within the range that can provide the effect of the present invention while the oxide film formed on the silicon single-crystal substrate is removed substantially entirely.

What is claimed is:

1. A nitride semiconductor substrate having an initial nitride and a nitride semiconductor sequentially stacked on one principal plane of a base substrate, wherein
   the nitride semiconductor substrate comprises recesses depressed from an interface between the base substrate and the initial nitride toward the base substrate along one arbitrary cross section, and the recesses each have a diameter of 6 nm or more and 60 nm or less and are formed at a density of $3 \times 10^8$ pieces/cm$^2$ or more and $1 \times 10^{11}$ pieces/cm$^2$ or less,
   the recess is different from the base substrate in at least one of composition, crystal structure, crystal orientation, and crystal phase, and
   the recess is at least one of a space and a mode filled with a polycrystalline or amorphous inorganic material.

2. A nitride semiconductor substrate having an initial nitride and a nitride semiconductor sequentially stacked on one principal plane of a base substrate, wherein
   the nitride semiconductor substrate comprises recesses depressed from an interface between the base substrate and the initial nitride toward the base substrate along one arbitrary cross section, and the recesses each have a diameter of 6 nm or more and 60 nm or less and are formed at a density of $3 \times 10^8$ pieces/cm$^2$ or more and $1 \times 10^{11}$ pieces/cm$^2$ or less,
   the recess has a depth of 3 nm or more and 45 nm or less from the interface between the base substrate and the initial nitride toward the base substrate,
   the recess is different from the base substrate in at least one of composition, crystal structure, crystal orientation, and crystal phase, and
   the recess is at least one of a space and a mode filled with a polycrystalline or amorphous inorganic material.

* * * * *